United States Patent [19]

Philofsky et al.

[11] Patent Number: 4,527,185
[45] Date of Patent: * Jul. 2, 1985

[54] INTEGRATED CIRCUIT DEVICE AND SUBASSEMBLY

[75] Inventors: Elliott Philofsky, Myrtle Beach, S.C.; Ward Parkinson; Dennis Wilson, both of Boise, Id.

[73] Assignee: AVX Corporation, Great Neck, N.Y.

[*] Notice: The portion of the term of this patent subsequent to Jun. 12, 2001 has been disclaimed.

[21] Appl. No.: 568,291

[22] Filed: Jan. 6, 1984

Related U.S. Application Data

[63] Continuation of Ser. No. 224,127, Jan. 12, 1981, abandoned.

[51] Int. Cl.$^3$ .................. H01L 23/14; H01L 25/02; H01L 23/48
[52] U.S. Cl. ............................. 357/70; 357/80; 357/75
[58] Field of Search ............... 357/80, 51, 75, 70

[56] References Cited

U.S. PATENT DOCUMENTS

| | | | |
|---|---|---|---|
| 3,559,285 | 2/1971 | Kauffman | 357/70 |
| 3,617,817 | 11/1971 | Kawakastu | 357/80 |
| 3,866,311 | 2/1975 | Salles et al. | 357/51 |
| 3,942,245 | 3/1976 | Jackson et al. | 357/70 |
| 4,079,511 | 3/1978 | Grabbe | 357/70 |
| 4,200,880 | 4/1980 | Frey | 357/80 |
| 4,234,666 | 11/1980 | Gursky | 357/70 |
| 4,249,196 | 2/1981 | Durney et al. | 357/80 |
| 4,303,934 | 12/1981 | Stitt | 357/80 |
| 4,454,529 | 6/1984 | Philofsky et al. | 357/75 |

FOREIGN PATENT DOCUMENTS

91152 7/1980 Japan .................. 357/80

OTHER PUBLICATIONS

"Decoupling Capacitor Placement"—Parisi—IBM Technical Disclosure, vol. 19, No. 8, pp. 3046-3047, 1-1977.

Primary Examiner—Andrew J. James
Assistant Examiner—Sheila V. Clark
Attorney, Agent, or Firm—Arthur B. Colvin

[57] ABSTRACT

The present invention relates to an integrated circuit device particularly of the type carrying multiple memory circuits or the like. The device incorporates a lead frame of the sort which includes an elongate metallic web and is characterized by the lead frame providing an integral seat or platform whereon is mounted a capacitor device which is connected or adapted to be connected in shunting relation of the power supply inputs to the integrated circuit device, whereby the capacitor provides a convenient mounting platform for the circuit bearing elements and also assures minimal lead lengths between the capacitor and the power supply inputs of the circuit bearing chip. Due to the shortness of such lead lengths and consequent reduction of the inductance reactance of the power supply circuit, efficient dampening of switching transients is achieved with the use of capacitors of much smaller values, in less area than heretofore required in external dampening applications.

2 Claims, 7 Drawing Figures

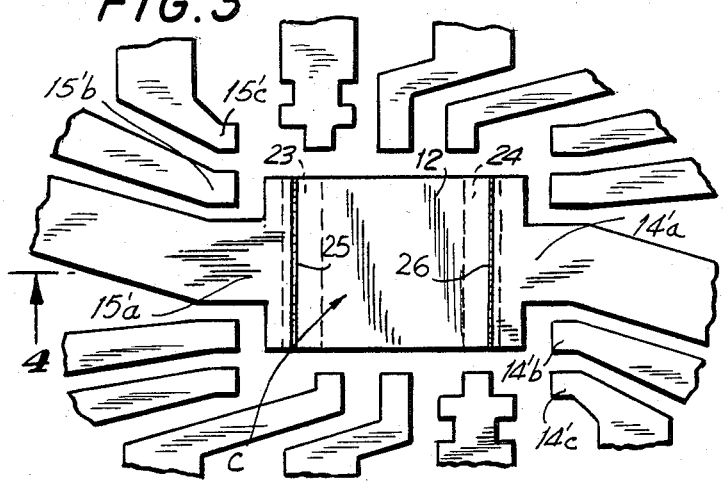
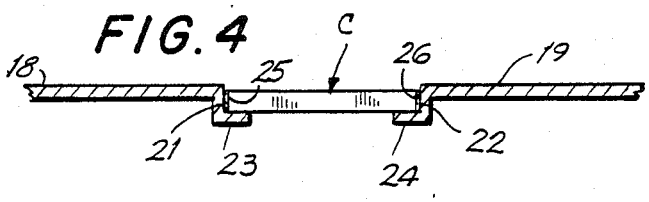
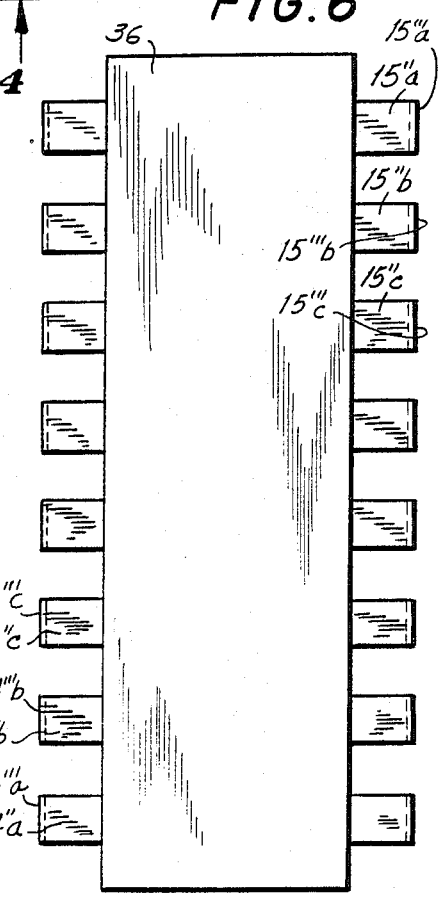
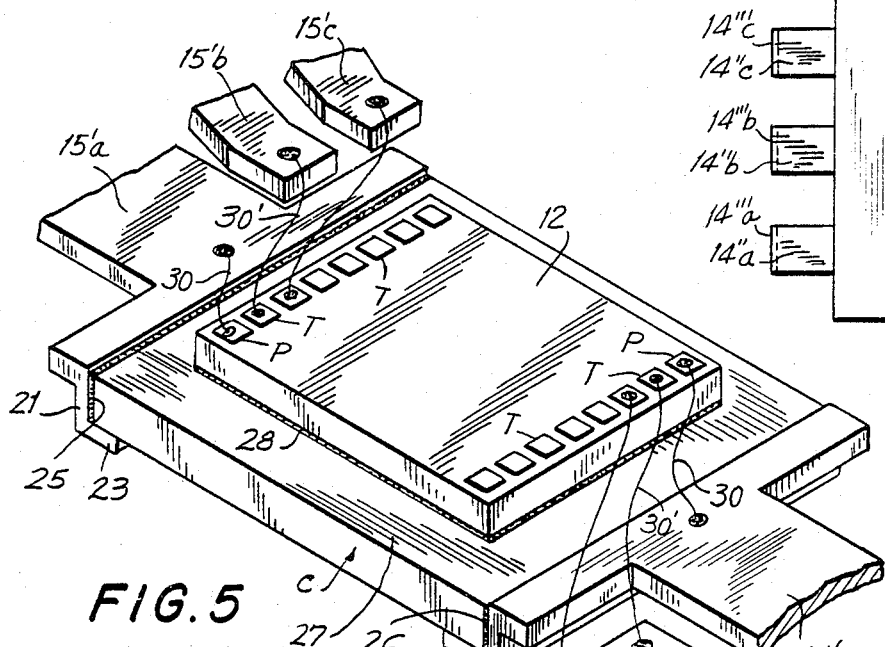
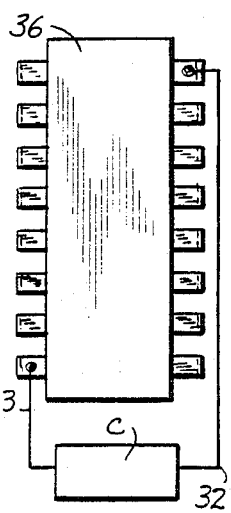

INTEGRATED CIRCUIT DEVICE AND SUBASSEMBLY

This application is a continuation of application Ser. No. 224,127, filed Jan. 12, 1981, now abandoned.

BACKGROUND OF THE INVENTION

1. Field of the Invention

The present invention is in the field of integrated circuit (IC) devices and particularly IC devices utilized as memory circuits.

Still more particularly, the present invention pertains to an improved IC device and lead frame subassembly therefor having improved decoupling characteristics and enabling the formation of more compact memory assemblies.

2. The Prior Art

The use of IC devices, particularly as components of memory circuits, is widespread. When one or more of the switching circuit elements of an IC are activated, current and voltage transients are generated, which transients are injected into the power supply circuit which is in turn linked to other elements of the memory system. Where the transient energy of the pulses approaches the characteristics of a functional signal, it is possible to obtain a false reading or transmission of false information, resulting in what is known in the industry as "soft error".

In order to reduce the instances of soft error, it is conventional to employ decoupling or by-passing capacitors bridging the power supply inputs of the IC, whereby transient energy (noise) is absorbed rather than being transmitted to the rest of the IC circuits through the power supply connections.

Heretofore, in circuits employing ICs of the lead frame type, the decoupling has been effected by mounting a capacitor on the printed circuit (PC) board adjacent to and externally of each IC, the leads of the capacitor being connected via the PC wiring across the power supply terminals of the IC. The series combination of lead length and wiring increases the effective impedance of the capacitor, rendering it less effective, especially for shunting high frequency current transients such as are typically produced by dynamic IC memory circuits. Yet, these circuits require that the power supply be maintained ±10% to correctly maintain data stored within the memory. The value of the capacitors heretofore required to be employed has been substantial, on the order of 0.1 to 2 mfd.

Capacitors having such relatively high electrical values, in addition to being expensive, are bulky, whereby the desired goal of circuit compactness is frustrated.

SUMMARY OF THE INVENTION

The present invention may be summarized as directed to an improved lead frame subassembly of the type which is fabricated from a punched-out or etched elongate metal band or web and is characterized in that the metal frame components of the lead frame are constructed and arranged mechanically to support a capacitor which is electrically shunted across the power supply conductors of the lead frame, the capacitor serving as the support for an IC die or chip. The power supply terminals of said IC die are conventionally connected to the power supply conductors of the lead frame through short lead sections or jumpers or wire bond thread.

It has been established that the lead length in decoupling circuits heretofore known is a significant factor in adversely increasing the magnitude of the unwanted power supply pulses or transients generated due to the inductive reactance created by the long leads, and that by juxtaposing the capacitor intimately adjacent the power supply terminals of the IC chip, with consequent reduced lead length in the decoupling circuit, small capacitance values are able to effect pulse dampening. By way of example and without limitation, a capacitance value of 0.05 mfd inserted next to the IC chip and shunted internally across the power supply terminals thereof, is capable of effectively dampening current pulses which theretofore required between 0.1 and 2 mfd, of external capacitance depending on the frequency of the current pulse.

The invention more specifically is directed to a lead frame of the type comprising a web punched to define a lattice-work of spaced metal components which will ultimately act as conductors, at least one of the components of the lead frame being deflected from the plane of the metal web and defining a seat for the mounting of a capacitor which is both electrically and mechanically supported thereon. The capacitor provides a mounting platform for a IC die or chip, the power supply terminals of which are electrically connected to components of the lead frame, which are in electrical connection with and provide physical support for the terminals of the capacitor. Under such circumstances, the lead length between the decoupling capacitor and the power supply terminals of the chip is rendered extremely short, whereby the inductance reactance normally added by conventional leads and PC wiring is minimized.

Accordingly, it is an object of the present invention to provide an improved lead frame subassembly adapted, by the addition of an appropriate circuit bearing silicon die or chip, to be formed into an IC device characterized in that the capacitor is interrelated with the metallic components of the lead frame in such manner that the capacitor forms a physical support for the chip, and the leads between power supply input of the IC chip and the capacitor are maintained at a minimum length.

Still a further object of the invention is the provision of an IC device fabricated from a lead frame subassembly of the type described.

A further object of the invention is the provision of an IC device of the lead frame type, i.e., a device fabricated from skeletal components of a stamped metal web and, in addition, including an internal capacitor component which effectively decouples the power supply circuit against the transmission of switching transients, the value of the capacitance being only a small fraction of the value of the capacitance required where external decoupling is employed.

Still a further object of the invention is the provision of a lead frame subassembly of the type described and comprising a multiplicity of interconnected lead frame components adapted to be handled by automatic processing machinery, each of the noted components incorporating an internal decoupling capacitor which also functions as a mechanical support for a silicon chip or the like.

To attain these objects and such further objects as may appear herein or hereinafter pointed out, reference is made to the accompanying drawings, forming a part hereof, in which:

FIG. 3 is a fragmentary plan view of the lead frame subassembly after the capacitor has been integrated thereinto;

FIG. 4 is a vertical section taken on the line 4—4 of FIG. 3;

FIG. 5 is a magnified perspective view of the lead frame with a IC silicon chip applied thereto showing connections extending to the chip;

FIG. 6 is a plan view of a completed IC device according to the invention; and

FIG. 7 is a plan view of a completed IC device according to the prior art.

Figure 1:
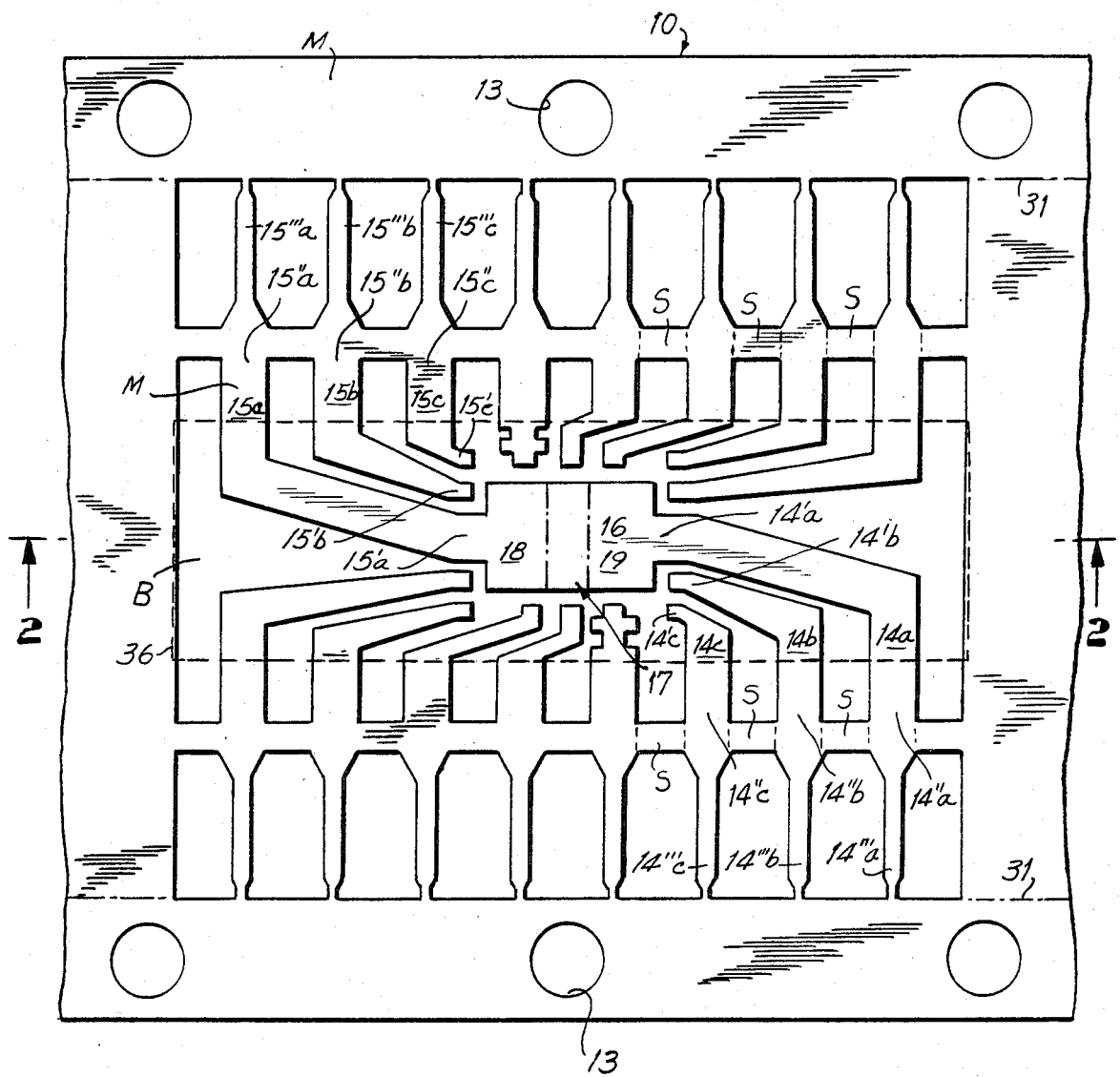
FIG. 1 is a plan view of a short section of an elongated web defining a series of IC lead frames.
Figure 2:
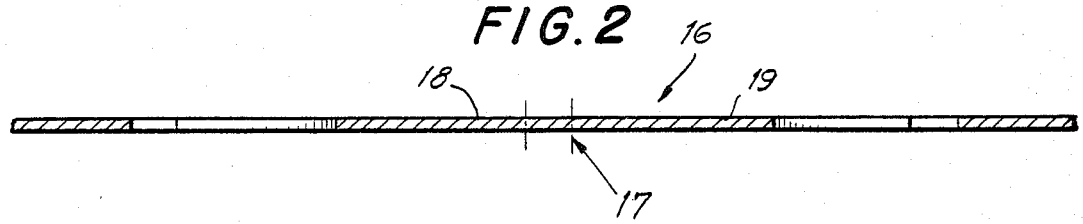
FIG. 2 is a vertical section taken on the line 2—2 of FIG. 1.

Turning now to the drawings, there is shown in FIG. 1, an elongate web of metal 10 which has been etched or punched, in a manner known per se, to provide a multiplicity of blanked out areas, the metal components M remaining between the blanked out portions B being employed to form conductors for attachment internally to an IC chip 12 and externally between the IC device and a PC board or the like.

The lead frame web 10 may include a plurality of drive apertures or sprocket openings 13 adapted to be engaged with automatic processing equipment for the carrying out of the various subsequent steps necessary for the conversion of the metallic lattice work to a finished IC device.

The lead frame includes a series of conductor portions 14a, 14b, 14c, etc. and 15a, 15b, 15c, etc., which, in the finished IC device depicted in FIG. 6, are substantially embedded within a mass of polymeric material 36.

It will be understood, as is conventional, that the conductor portions 14a, 14b, 14c etc., and 15a, 15b, 15c, etc. have inner terminal portions 14'a, 14'b, 14'c, etc. and 15'a, 15'b, 15'c, etc. to which the terminals of the IC chip 12 will be connected in the manner hereinafter described. The conductor portions also have intermediate terminal portions 14"a, 14"b, 14"c, etc. and 15"a, 15"b, 15"c, etc., which lead to the external terminal portions 14'"a, 14'"b, and 15'"a, 15'"b, etc. that protrude from the finished IC device as shown in FIG. 6 for connection to the external circuit.

As thus far described, the lead frame per se is essentially conventional.

In accordance with the invention, the conductor portions 14a, 15a, which will ultimately define the inputs to the power supply circuit have their inner terminal ends 14'a, 15'a, initially linked by a central bridge 16.

The next step in the manufacture of the lead frame subassembly according to the invention, resides in severing the central bridge 16, substantially along a central severance region 17, FIG. 1, to define two discrete metal components 18, 19. By the use of a suitable forming tool, the components 18, 19 are then bent to define vertical legs 21, 22 and horizontal legs 23, 24.

As best seen in FIGS. 4 and 5, horizontal legs 23, 24 define support platforms for a capacitor C, which is preferably of the multi-layer ceramic type. The end terminations 25, 26 of the capacitor are electrically and mechanically connected, as by soldering to the vertical legs 21, 22 and horizontal legs 23, 24.

The capacitor C incorporates an upper surface portion 27, which provides a bed or support for the IC chip 12. Optionally, but preferably the chip 12 is seated on an epoxy or like adhesive layer 28 mounted atop the upper surface 27 of the capacitor C. Thereupon, the inner terminal ends 14'a, and 15'a, are connected to the respective power terminals P of chip 12 in conventional manner by leads 30.

From the foregoing description, it will be evident that the outer terminal portion 14"a, through conductor portion 14a is now electrically connected to end termination 26 of the capacitor C. In similar manner, the outer terminal portions 15'"a, through conductor portion 15a, is electrically connected to the end termination 25 of the capacitor, whereby the capacitor will be disposed in bridging relation of the power supply terminals P of the IC chip.

Thereupon, the other terminals T of the chip 12 are connected in conventional manner by leads 30' to the respective inner terminal ends 14' and 15' of the lead frame 10, and the latticework is severed to remove shunting portions S between the conductors (FIG. 1).

After completion of the subassembly, including the lead frame, capacitor and IC chip 12, the subassembly is then embedded in the polymeric mass 36 thereby defining a block. The polymeric block hermetically seals the components and retains the conductor portions in fixed position. Each unit is then severed along lines 31, 31, shown in FIG. 1 so that the conductor portion 14a, 14b, 15a, 15b, etc. will be separated from the remaining portions of the web and only the ends 14"a, 15"a, etc. of the conductor portions and the leads 14'"a and 14'"a etc. protrude from the polymeric block 16. Then the leads 14'"a and 15'"a etc. are bent to enable insertion in the PC board mounting holes.

As will be recognized by those skilled in the art, a lead frame subassembly comprising one or a series of interconnected lead frames, each with a capacitor mounted thereon, may be supplied to manufacturers of integrated circuit devices as a useful article of manufacture. The manufacturer may process the lead frame subassemblies in a manner similar to the prior conventional procedures. However, instead of mounting the IC chip on a metal portion of the lead frame as in the prior conventional procedure, the IC chip is mounted on an epoxy layer 28 which may be applied to the surface 27 of the capacitor C just prior to emplacement of the IC chip thereon, the epoxy affording a means of securing the IC chip in fixed position. Subsequent processing steps as carried out by the manufacturer are identical to those now practiced in respect of conventional IC devices being manufactured. That is to say, after emplacement and fastening of the IC chip, the various connections as by leads 30 and 30' are made between appropriate ones of the inner terminals 14'a, 14'b, 14'c, etc. and 15'a, 15'b, 15'c, etc. of the metal lead frame and the respective terminals P and T of the IC chip 12. The unit is then embedded in a polymeric mass to form a block and the unit is then severed from the remaining portion of the web and the leads formed.

From the foregoing description, it will be appreciated that there is disclosed in accordance with the invention, an improved lead frame subassembly adapted for the mounting of an IC chip characterized in that a capacitor is incorporated in intimate juxtaposition to the IC chip and the power supply terminals thereof. Since the connection between the capacitor and the power supply terminals P of the chip is limited merely to the length of the short leads 30 rather than the relatively long leads 32, 33 of the prior art device, FIG. 7, the inductive components of the circuit are reduced to a minimum, whereby the capacitance necessary for dampening switching pulses generated is reduced substantially compared to externally placed decoupling capacitors.

It will further be observed that, in accordance with the invention, there is disclosed an improved IC device carrying an internal dampening capacitor, the external dimensions of the IC being no greater than those of a conventionally fabricated IC device. The use of an external decoupling capacitor may be entirely dispensed with, with resultant space and cost savings.

As will be understood by those skilled in the art and familiarized with the instant disclosure, numerous variations and modifications may be made therein without departing from the spirit thereof, which is considered to reside in the concept of employing in a conventional metallic lead frame device, a capacitor member which at once defines a structural support for the circuit bearing components of the device, i.e. the IC chip, and functions as a decoupling capacitor. Accordingly, the invention is to be broadly construed within the scope of the appended claims.

Having thus described the invention and illustrated its use, what is claimed as new and is desired to be secured by Letters Patent is:

1. A integrated circuit device comprising in combination, a mass of polymeric insulating material, a lattice work of metal formed from integral web embedded in said mass, said lattice work including a plurality of conductor member having portions disposed in coplanar alignment within said mass, said conductor members including contact portions extending outwardly of said mass, a pair of said conductor members within said mass having spaced inner terminal ends defining a support platform, said platform including a pair of spaced mounting portions displaced from the plane of said conductor portions, said mounting portions each comprising a first leg member extending generally perpendicularly away from said plane of said conductor portions, and a second leg member extending from said first leg member, said second leg members being disposed in substantially coplanar alignment with each other and in a plane generally parallel to said plane of said conductor portions, a combined capacitor and silicon chip sub-assembly mounted on said platform, said sub-assembly including a capacitor having opposed generally parallel end portions, said end portions including metallic terminations, said capacitor including a upper surface and a lower surface extending between said end portions, a silicon chip member bonded to said upper surface of said capacitor by an adhesive layer intervening between said upper surface and said chip member, said chip member including a plurality of circuit means and a pair of power supply contacts, said sub-assembly being mounted on said platform with each said end portion of said capacitor disposed in abutting relation with a respective one of said first leg members, and said under-surface of said capacitor disposed on said second leg member, said adhesive layer, in said mounted position of said sub-assembly being disposed in substantial alignment with the plane of said conductor members, each said termination of said capacitor being electrically and mechanically connected through a respective one of said mounting portions, a first pair of circuit conductor means displaced from the surface of said capacitor and connecting a respective said mounting portion to a said power supply contact of said chip member whereby said power supply contacts of said chip member are shunted by said capacitor, and additional circuit conductor means displaced from the surface of said capacitor and connecting said circuit means of said chip member with others of said conductor members.

2. As a new article of manufacture a lead frame sub-assembly adapted to be manufactured into a series of integrated circuit components, said sub-assembly including an elongate metallic web defining a multiplicity of lead frames, each said lead frame defining an open lattice work of metal forming a plurality of conductive paths defining conductor portions arrayed in a plane, a central platform formed on said lead frames, said platform including a pair of spaced mounting portions displaced from the plane of said conductor portions, said mounting portions each comprising a first leg member extending generally perpendicularly away from said plane of said conductor portions and a second leg member, said second leg members being disposed in substantially coplanar alignment with each other and in a plane generally parallel to said plane of said conductor portions, a capacitor member mounted on each of said platforms, said capacitor members having opposed generally parallel end portions, said end portions including metallic terminations, said capacitor members including an upper surface and a lower surface extending between said end portions, said lower surfaces being supported on said second leg members, each said end of said capacitor being disposed in abutting relation to a respective one of said first leg portions, said upper surfaces of said capacitors being in substantial coplanar alignment with the plane of said conductive paths, said terminations of said capacitors each being electrically and mechanically bonded to a respective one of said mounting portions.

* * * * *